(12) United States Patent
Pippert et al.

(10) Patent No.: US 9,861,009 B2
(45) Date of Patent: Jan. 2, 2018

(54) VALVE DIVERTER WITH HEAT SINK

(71) Applicant: SIEMENS AKTIENGESELLSCHAFT, Munich (DE)

(72) Inventors: Erhard Pippert, Dallgow-Doeberritz OT Seeburg (DE); Guenter Sachs, Herzogenaurach (DE); Dirk Springborn, Berlin (DE); Markus Sulitze, Falkensee (DE)

(73) Assignee: Siemens Aktiengesellschaft, Munich (DE)

( * ) Notice: Subject to any disclaimer, the term of this patent is extended or adjusted under 35 U.S.C. 154(b) by 415 days.

(21) Appl. No.: 14/423,184

(22) PCT Filed: Jun. 25, 2013

(86) PCT No.: PCT/EP2013/063177
§ 371 (c)(1),
(2) Date: Feb. 23, 2015

(87) PCT Pub. No.: WO2014/029528
PCT Pub. Date: Feb. 27, 2014

(65) Prior Publication Data
US 2015/0223368 A1 Aug. 6, 2015

(30) Foreign Application Priority Data
Aug. 22, 2012 (EP) .................................... 12181294

(51) Int. Cl.
*H01C 7/12* (2006.01)
*H01C 7/10* (2006.01)
(Continued)

(52) U.S. Cl.
CPC ........... *H05K 7/20409* (2013.01); *F28F 1/12* (2013.01); *H01C 1/084* (2013.01); *H01C 7/12* (2013.01)

(58) Field of Classification Search
CPC ........... H01C 7/12; H01C 7/126; H02H 9/042
(Continued)

(56) References Cited

U.S. PATENT DOCUMENTS

| 2,870,307 A | * | 1/1959 | Milliken | .................. | H01C 1/02 338/205 |
| 4,335,417 A | | 6/1982 | Sakshaug et al. | | |
| 6,396,676 B1 | | 5/2002 | Doone et al. | | |

FOREIGN PATENT DOCUMENTS

| CA | 1131297 A1 | 9/1982 |
| CA | 1162978 A1 | 2/1984 |

(Continued)

OTHER PUBLICATIONS

JP-S54-28035, Entire speficiation and Figures 1 to 4.*

*Primary Examiner* — Dharti Patel
(74) *Attorney, Agent, or Firm* — Laurence A. Greenberg; Werner H. Stemer; Ralph E. Locher

(57) ABSTRACT

A valve-type arrester includes a heat sink for dissipating heat from the interior of the valve-type arrester into the surroundings of the valve-type arrester. The heat sink has a circular-cylindrical main body with a base surface, a top surface parallel to the base surface and a casing surface connecting the base surface and the top surface. The heat sink additionally has a plurality of fins disposed on the main body, in which each fin is formed in the shape of a sheet or a leaf and disposed on the casing surface of the main body.

9 Claims, 3 Drawing Sheets

(51) Int. Cl.
*H05K 7/20* (2006.01)
*H01C 1/084* (2006.01)
*F28F 1/12* (2006.01)

(58) Field of Classification Search
USPC .......................................................... 361/127
See application file for complete search history.

(56) References Cited

FOREIGN PATENT DOCUMENTS

| | | |
|---|---|---|
| CN | 2429917 Y | 5/2001 |
| CN | 201517902 U | 6/2010 |
| CN | 201983013 U | 9/2011 |
| DE | 509088 C | 10/1930 |
| DE | 3417648 A1 | 10/1985 |
| FR | 941621 A | 1/1949 |
| FR | 1505393 A | 12/1967 |
| GB | 2322487 A | 8/1998 |
| JP | S5428035 U | 2/1979 |
| JP | S5878601 U | 5/1983 |
| JP | S62202503 A | 9/1987 |
| JP | H08316007 A | 11/1996 |
| JP | 2000114007 A | 4/2000 |

\* cited by examiner

VALVE DIVERTER WITH HEAT SINK

BACKGROUND OF THE INVENTION

Field of the Invention

The invention relates to a valve-type arrester and to a heat sink for a valve-type arrester.

Valve-type arresters are surge arresters for limiting overvoltages. Valve-type arresters are used, in particular, in closed halls in which they can be designed as apparatuses without a housing. Valve-type arresters without housings are used, for example, to limit overvoltages in what are known as valve towers of systems for high-voltage direct current transmission. Semiconductor switches, primarily thyristors, which can be damaged or destroyed by high overvoltages are used in valve towers of this kind. Valve-type arresters without a housing are often cooled in order to increase their load-bearing capacity.

BRIEF SUMMARY OF THE INVENTION

The invention is based on the object of specifying a valve-type arrester with improved cooling.

According to the invention, the object is achieved by a valve-type arrester having a heat sink as described below.

Advantageous refinements of the invention are the subject matter of the dependent claims.

A valve-type arrester according to the invention having a heat sink allows heat to be dissipated from the interior of the valve-type arrester into an area surrounding the valve-type arrester. The heat sink has a circular-cylindrical main body, the surface of said main body having a base surface, a top surface which is parallel to the base surface, and a casing surface which connects the base surface and the top surface. The heat sink further has a plurality of fins which are arranged on the main body, wherein each fin is of sheet-like design and is arranged on the casing surface of the main body. The valve-type arrester according to the invention has a plurality of heat sinks according to the invention and a plurality of discharging resistors, preferably metal-oxide resistors. In this case, each heat sink is arranged between two discharging resistors, so that the top surface and the base surface of each heat sink are each in thermal contact with a discharging resistor, and a surface of each fin of each heat sink forms an outer surface of the valve-type arrester.

Heat can advantageously be absorbed by the main body and routed to the fins. The arrangement of the fins on the casing surface, that is to say on the outer face of the main body, allows the heat to be discharged to an area surrounding the valve-type arrester in this case. The sheet-like design of the fins generates a surface for emitting heat to the area surrounding the valve-type arrester, which surface is larger than the casing surface of the heat sink. The circular-cylindrical design of the main body is matched to the proven cylindrical structural shape of valve-type arresters and allows, in particular, simple stacking and good thermal contact between heat sinks and discharging resistors of a valve-type arrester.

A first preferred refinement of the invention makes provision for each fin to be in the form of a substantially planar flat body and to form an inclination angle, which is different from 90 degrees, with the base surface of the main body. In this case, a flat body is to be understood to mean a three-dimensional body which extends along a two-dimensional surface of extent and of which the maximum extension along surface normals of the surface of extent is substantially less than a linear extension of the surface of extent. A flat body is called substantially planar when the surface of extent is planar. An angle of a substantially planar flat body with a plane is to be understood to mean an angle between the surface of extent of the flat body and the plane.

This refinement of the invention is particularly advantageous when a plurality of heat sinks of a valve-type arrester are arranged one above the other, so that the cylinder axes of said heat sinks are arranged vertically, that is to say parallel to the direction of gravity. In this case, specifically the surfaces of the fins are arranged obliquely to the direction of gravity, so that the direction of gravity does not run in these surfaces. As a result, the projections of these surfaces onto a plane which is orthogonal to the direction of gravity increase in size in relation to an orientation of the fins along the direction of gravity. The fins of a heat sink therefore provide heated air, which rises in the field of gravity, with a larger effective surface area for heat emission. In addition, said fins deflect the rising air, so that an air flow which rises in a helical manner is produced, this air flow generating increased exchange of air in the area surrounding the valve-type arrester. Both the increase in size of the effective heat emission surface area of the fins and also the increase in the exchange of air advantageously improve the cooling action of the heat sinks.

A further configuration of this first refinement of the invention makes provision for all of the fins to form the same inclination angle with the base surface of the main body.

As a result, all of the fins are oriented obliquely to the direction of gravity to the same extent. This allows air to flow in the area surrounding the valve-type arrester in a manner which can be predicted and planned and, in particular, prevents air from building up.

An alternative second preferred refinement of the invention makes provision for at least one fin to be in the form of a bent flat body. In this case, a bent flat body is to be understood to mean a flat body of which the plane of extent has curved geodetic lines.

This refinement of the invention also advantageously allows the cooling action of the fins to be improved by increasing the size of the effective heat emission surface area of the fins and increasing the exchange of air by influencing the air flow in the area surrounding the valve-type arrester.

In both refinements of the invention, each fin preferably protrudes in a perpendicular manner from the casing surface of the main body.

As a result, the distance between the fin surfaces and the casing surface of the main body is advantageously maximized, and as a result the cooling action of the fins is further optimized.

Furthermore, the heat sink is preferably produced from an electrically conductive material, for example from aluminum.

As a result, the heat sink can advantageously also be used for guiding current, as well as for heat dissipation, in the valve-type arrester.

Heat can advantageously be emitted from the two discharging resistors to the heat sinks, routed to the fins and, from said fins, emitted to the air in the area surrounding the valve-type arrester by the heat sinks being arranged between in each case two discharging resistors and the fins being arranged on the outer face of the valve-type arrester. The improved cooling action of the heat sinks advantageously improves the load-bearing capacity of the valve-type arrester. Therefore, given the same permanent voltage, a considerably lower protection level can be achieved by means of a valve-type arrester according to the invention, as a result of which so-called valve levels, that is to say discharging resistor layers, can be saved and the size of the valve-type arrester can be reduced.

The discharging resistors and the heat sinks are preferably arranged stacked one above the other in the manner of a tower, wherein the base surfaces of all of the heat sinks are perpendicular to a longitudinal axis of the valve-type arrester.

This refinement of the valve-type arrester allows the cooling action of the fins to be advantageously improved, as already mentioned above, by increasing the size of the effective heat emission surface area of the fins and increasing the exchange of air by deflecting the air stream in the area surrounding the valve-type arrester when the longitudinal axis of the valve-type arrester is oriented in the direction of gravity.

Furthermore, the valve-type arrester preferably has, for example silicone, insulating elements which at least partially surround the discharging resistors and electrically insulate said discharging resistors from an area surrounding the valve-type arrester.

In particular, the insulating elements advantageously prevent a creepage current along the outer face of the valve-type arrester.

In a further preferred refinement of the valve-type arrester, each heat sink is produced from an electrically conductive material and electrically connects the discharging resistors, between which it is arranged, to one another.

In this way, the heat sinks are advantageously used for electrically interconnecting the discharging resistors, so that, in particular, no additional electrical connections of the discharging resistors are required.

Furthermore, at least one heat sink preferably bears against a discharging resistor.

This refinement of the invention allows direct thermal and possibly also electrical contact between heat sink and discharging resistor and simplifies the design of the valve-type arrester.

BRIEF DESCRIPTION OF THE SEVERAL VIEWS OF THE DRAWING

The above-described properties, features and advantages of this invention and also the manner in which these are achieved will become clearer and more distinctly comprehensible in connection with the following description of the exemplary embodiments which are explained in more detail in connection with the drawings, in which.

DESCRIPTION OF THE INVENTION

Parts which correspond to one another are provided with the same reference symbols throughout the figures.

Figure 1:
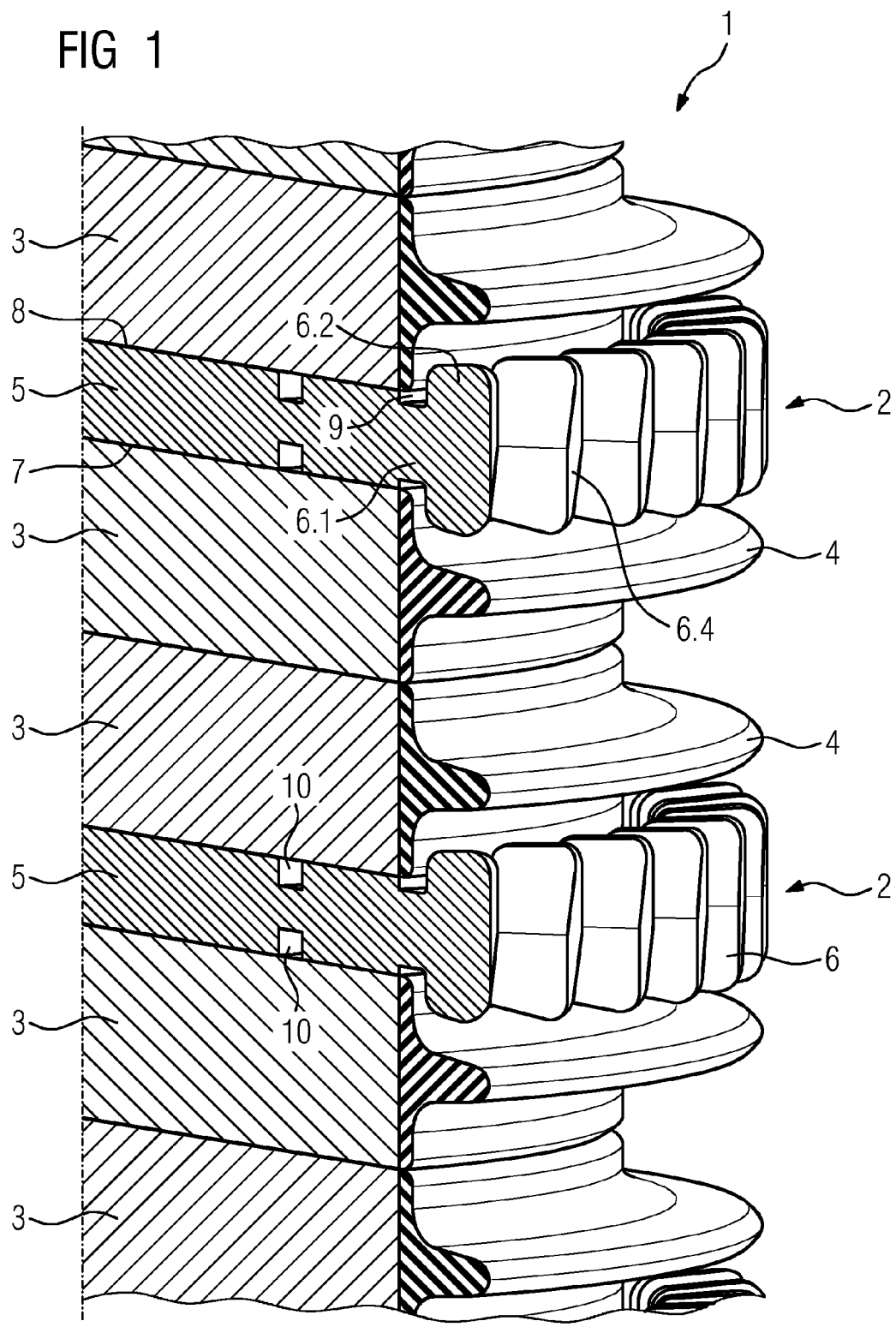
FIG. 1 shows a detail of a perspective sectional illustration of a valve-type arrester.
Figure 2:
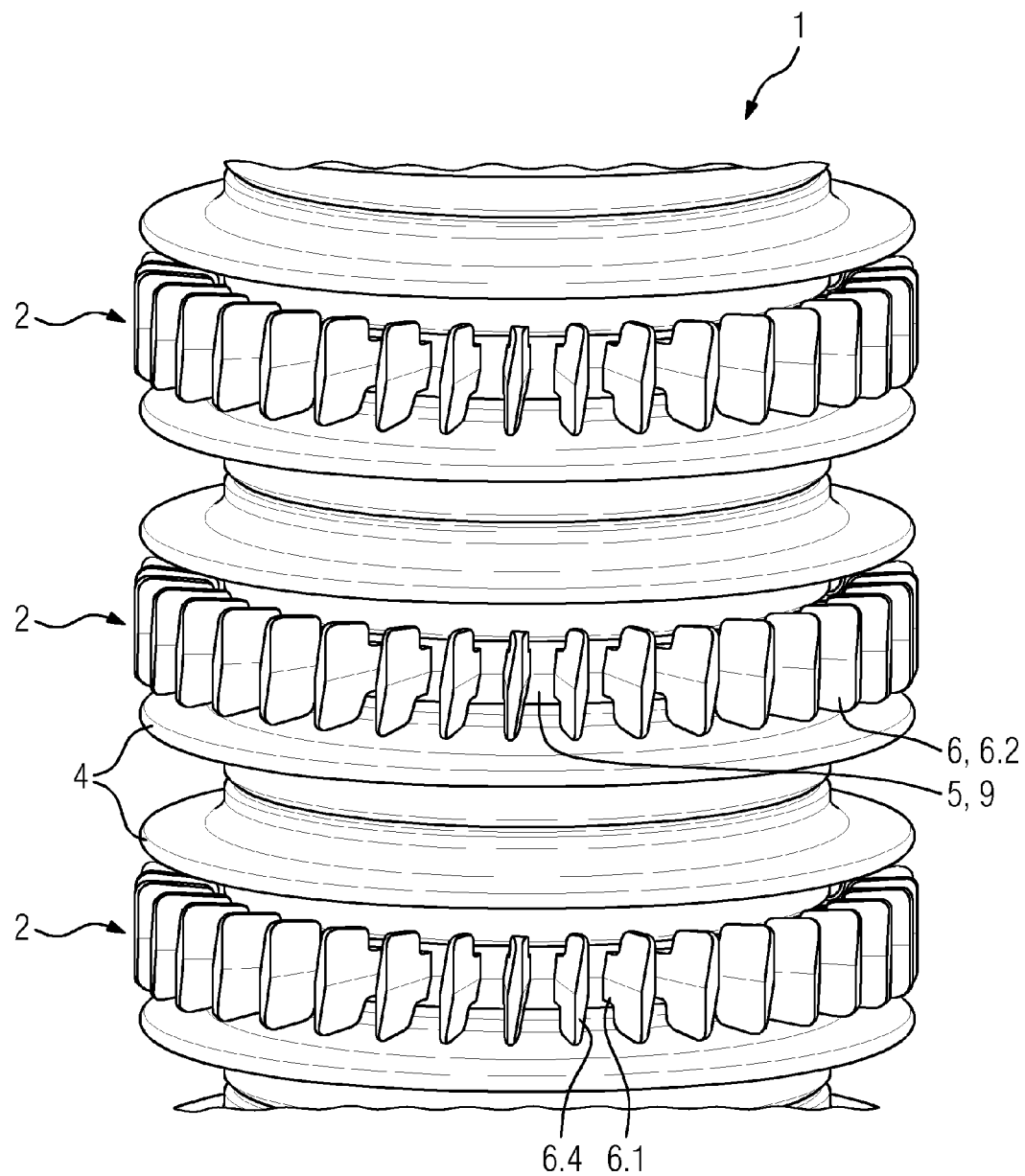
FIG. 2 shows a perspective illustration of a portion of a valve-type arrester.

FIGS. 1 and 2 show details of a valve-type arrester 1. FIG. 1 shows a perspective sectional illustration of the valve-type arrester 1, and FIG. 2 shows a perspective illustration of a portion of the valve-type arrester 1.

The valve-type arrester 1 has a plurality of heat sinks 2, a plurality of discharging resistors 3 and a plurality of insulating elements 4. In this case, the discharging resistors 3 and the heat sinks 2 are arranged stacked one above the other in the manner of a tower, so that each heat sink 2 is arranged between two discharging resistors 3.

Figure 3:
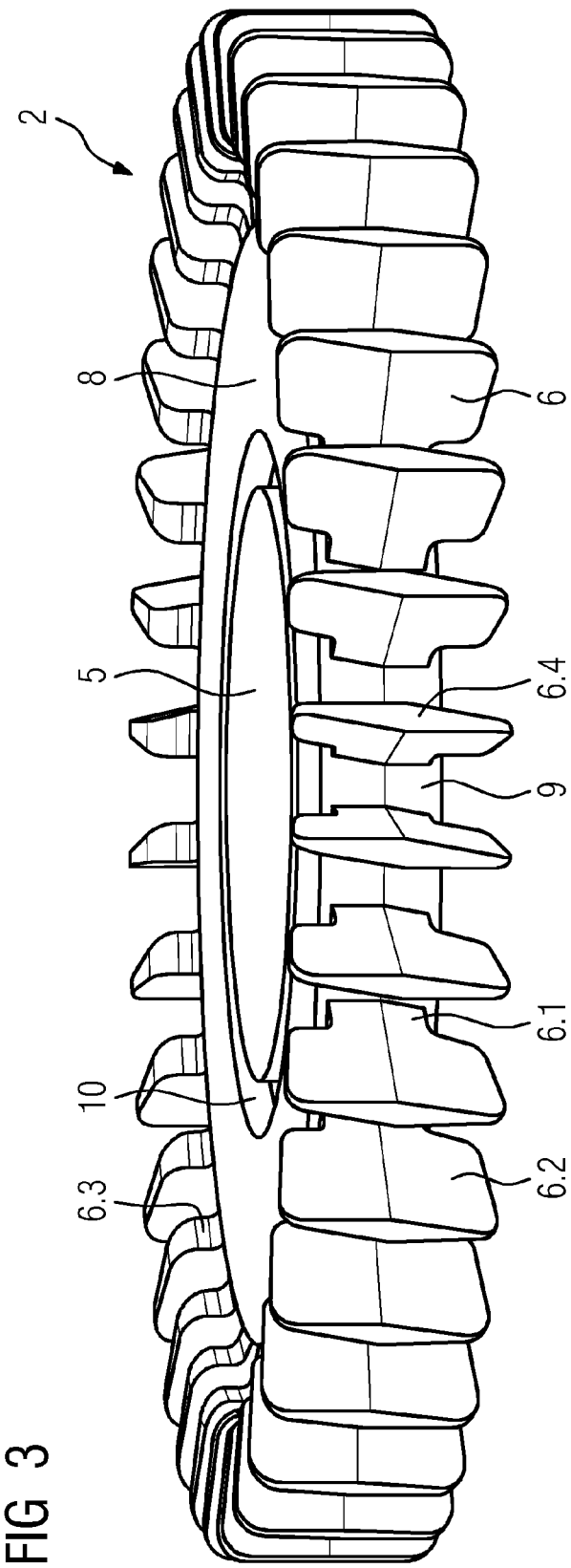
FIG. 3 shows a perspective illustration of a heat sink for a valve-type arrester.

FIG. 3 shows a perspective illustration of one of the heat sinks 2. The heat sink 2 is produced from aluminum and is of integral design. Said heat sink has a main body 5 and a plurality of sheet-like fins 6 which are arranged on the main body 5.

The main body 5 is substantially in the form of a flat circular cylinder, so that its surface has a planar base surface 7, a planar top surface 8, which is parallel to the base surface 7, and a not necessarily planar casing surface 9 which connects the base surface 7 and the top surface 8. The bottom face and the top face of the main body 5 optionally each have an annular groove 10 which makes it easier to position and secure the heat sink 2.

The fins 6 are arranged next to one another in the manner of ribs on the casing surface 9 of the main body 5 along a circumference of the casing surface 9 and each protrude in a perpendicular manner from the casing surface 9. Each fin 6 is in the form of a substantially planar flat body and has a web portion 6.1, which is connected to the casing surface 9, and an end portion 6.2, which adjoins the web portion 6.1. The end portion 6.2 is substantially in the form of a flat cube. In this case, a first side surface 6.3 of the cube is of diamond-shaped design, faces the casing surface 9 and is connected to the web portion 6.1. A second side surface 6.4, which is likewise diamond-shaped, runs parallel to the first side surface 6.3 and is averted from the casing surface 9.

The two diamond-shaped side surfaces 6.3, 6.4 of an end portion 6.2 each have a relatively long diagonal and a relatively short diagonal, wherein the relatively long diagonals of the two diamond-shaped side surfaces 6.3, 6.4 are arranged parallel to one another. These relatively long diagonals of the two diamond-shaped side surfaces 6.3, 6.4 delimit a cross-sectional surface of the end portion 6.2 which forms an inclination angle, which is different from 90 degrees, with a plane which is parallel to the base surface of the main body 5. In this case, the inclination angle is the same for all of the fins 6 of the heat sink 2. As a result, all of the fins 6 of the heat sink 2 are arranged obliquely to a cylinder axis of the main body 5.

The discharging resistors 3 are each in the form of circular-cylindrical metal-oxide resistors. The discharging resistors 3 and the main bodies 5 of the heat sinks 2 are arranged coaxially in relation to one another, so that the cylinder axes thereof lie on a straight line which forms a longitudinal axis of the valve-type arrester 1.

The radii of the base and top surfaces of the discharging resistors 3 correspond to the radii of the base surfaces 7 and top surfaces 8 of the main bodies 5 of the heat sinks 2. The base surface 7 of the main body 5 of a heat sink 2 bears against the top surface 8 of the discharging resistor 3 which is arranged beneath it, and the top surface 8 of the main body 5 of a heat sink 2 bears against the base surface 7 of the discharging resistor 3 which is arranged above it. The surfaces of the fins 6 form outer surfaces of the valve-type arrester 1.

The insulating elements 4 are produced from silicone. Said insulating elements are each of annular design and each surround the casing surface 9 of a discharging resistor 3. An inner surface of an insulating element 4, which inner surface faces a discharging resistor 3, bears against the casing surface 9 of the discharging resistor 3. The outer surface of an insulating element 4 has an outer curvature which runs in the manner of a brim of a hat.

The valve-type arrester 1 is arranged in a vertical manner, so that the longitudinal axis of said valve-type arrester runs in the direction of gravity. If, in the case of an overvoltage, a current flows through the valve-type arrester 1, the discharging resistors 3 heat up. The main bodies 5 of the heat sinks 2 absorb heat from the discharging resistors 3 and route said heat to their fins 6. The fins 6 emit heat to the air in the area surrounding the valve-type arrester 1. The heated air rises in the field of gravity. By virtue of the inclined position of the fins 6, an air flow of the heated air, which runs upward in a helical manner and is indicated by the direction of arrows in FIG. 2, is produced along the outer face of the valve-type arrester 1.

Even though the invention has been illustrated and described in detail by a preferred exemplary embodiment, the invention is not restricted by the disclosed examples and other variations can be derived from said examples by a person skilled in the art, without departing from the scope of the invention. For example, all or some of the fins 6 can be in the form of bent flat bodies rather than substantially planar flat bodies.

The invention claimed is:

1. A valve-type arrester, comprising:
   an interior and an outer surface defining surroundings of the valve-type arrester
   a plurality of discharging resistors; and
   a plurality of heat sinks for dissipating heat from said interior of the valve-type arrester to said surroundings the valve-type arrester;
   said heat sinks each including a circular-cylindrical main body having a base surface, a top surface parallel to said base surface, a casing surface interconnecting said base surface and said top surface and a plane parallel to said base surface;
   each of said heat sinks being disposed between a respective two of said discharging resistors placing said top surface and said base surface of each of said heat sinks in thermal contact with a respective one of said discharging resistors;
   said heat sinks each including a plurality of sheet-shaped fins disposed on said casing surface of said main body, each of said fins of each of said heat sinks having a surface forming said outer surface of the valve-type arrester; and
   each of said fins being a substantially planar flat body and forming an inclination angle different from 90 degrees with said plane parallel to said base surface of said main body or at least one of said fins being a bent flat body.

2. The valve-type arrester according to claim 1, wherein each of said fins is a substantially planar flat body forming said inclination angle different from 90 degrees with said plane parallel to said base surface of said main body, and all of said fins form the same inclination angle with said plane parallel to said base surface of said main body.

3. The valve-type arrester according to claim 1, wherein each of said fins protrudes perpendicularly from said casing surface of said main body.

4. The valve-type arrester according to claim 1, wherein said heat sinks are formed of an electrically conductive material.

5. The valve-type arrester according to claim 4, wherein said heat sinks are formed of aluminum.

6. The valve-type arrester according to claim 1, wherein said discharging resistors and said heat sinks are stacked one above the other in the manner of a tower, and said base surfaces of all of said heat sinks are perpendicular to a longitudinal axis of the valve-type arrester.

7. The valve-type arrester according to claim 1, which further comprises insulating elements at least partially surrounding said discharging resistors and electrically insulating said discharging resistors from said surroundings of the valve-type arrester.

8. The valve-type arrester according to claim 1, wherein each respective one of said heat sinks is formed of an electrically conductive material and electrically interconnects said discharging resistors between which said heat sink is disposed.

9. The valve-type arrester according to claim 1, wherein at least one of said heats sinks bears against a respective one of said discharging resistors.

* * * * *